United States Patent
Kang et al.

(10) Patent No.: US 8,551,888 B2
(45) Date of Patent: Oct. 8, 2013

(54) METHOD OF FORMING PATTERNS FOR SEMICONDUCTOR DEVICE

(75) Inventors: Yun-seung Kang, Seoul (KR);
Jong-chul Park, Hwaseong-si (KR);
Kwang-yong Yang, Seoul (KR);
Sang-sup Jeong, Suwon-si (KR);
Seok-hyun Lim, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 42 days.

(21) Appl. No.: 13/238,945

(22) Filed: Sep. 21, 2011

(65) Prior Publication Data
US 2012/0129349 A1 May 24, 2012

(30) Foreign Application Priority Data
Nov. 23, 2010 (KR) .................. 10-2010-0117103

(51) Int. Cl.
*H01L 21/302* (2006.01)
*H01L 21/461* (2006.01)

(52) U.S. Cl.
USPC ........... 438/725; 438/697; 438/717; 438/460; 438/257; 438/597; 438/709

(58) Field of Classification Search
USPC .......... 438/725, 597, 709, 257, 697, 717, 460
See application file for complete search history.

(56) References Cited

U.S. PATENT DOCUMENTS

| 7,429,536 B2 * | 9/2008 | Abatchev et al. ............ 438/725 |
| 8,207,614 B2 * | 6/2012 | Abatchev et al. ............ 257/774 |
| 8,227,354 B2 * | 7/2012 | Kim et al. ..................... 438/717 |
| 2006/0263699 A1 * | 11/2006 | Abatchev et al. ................. 430/5 |
| 2008/0290527 A1 * | 11/2008 | Abatchev et al. ............ 257/774 |
| 2010/0124815 A1 | 5/2010 | Sudo |
| 2010/0173492 A1 * | 7/2010 | Kim et al. ..................... 438/689 |
| 2012/0228742 A1 * | 9/2012 | Abatchev et al. ............ 257/618 |

FOREIGN PATENT DOCUMENTS

| JP | 2008-235462 | 10/2008 |
| KR | 1020090089497 A | 8/2009 |

* cited by examiner

*Primary Examiner* — Telly Green
(74) *Attorney, Agent, or Firm* — Muir Patent Consulting, PLLC

(57) ABSTRACT

A method of forming patterns for a semiconductor device. The method includes: forming a first hard mask layer on a layer which is to be etched; forming a second hard mask layer on the first hard mask layer, wherein the second hard mask layer includes a first portion and a second portion formed underneath the first portion, wherein the first portion and second portion are composed of the same material; etching the first portion to form first patterns; forming spacers covering sidewalls of the first patterns; etching the second portion using the spacers as etch masks to form second patterns; etching the first hard mask layer and the spacers using the second patterns disposed underneath the spacers as etch masks to form third patterns; and etching the layer to be etched, using the third patterns.

16 Claims, 9 Drawing Sheets

METHOD OF FORMING PATTERNS FOR SEMICONDUCTOR DEVICE

CROSS-REFERENCE TO RELATED APPLICATIONS

This application claims the benefit of Korean Patent Application No. 10-2010-0117103, filed on Nov. 23, 2010, in the Korean Intellectual Property Office, the disclosure of which is incorporated herein in its entirety by reference.

BACKGROUND

The disclosure relates to a method of forming patterns for a semiconductor device, and more particularly, to a method of forming patterns for a semiconductor device using double patterning.

The design rule for components of a semiconductor device has decreased with an increase in the integration of the semiconductor device. When a semiconductor device having fine patterns for coping with the high integration of the semiconductor device is manufactured, patterns having fine widths transcending a resolution limit of a photolithography process are to be realized. Also, a technique for reducing the number of applications of a photolithography process and the number of applications of a mask layer forming process and forming patterns having fine widths may be required.

SUMMARY

Some example embodiments provide a method of reducing the number of mask layers to form patterns for a semiconductor device without adding processes.

Some example embodiments also provide a method of forming patterns for a semiconductor device by which uniform line widths are maintained even when island patterns are formed.

According to one example embodiment, there is provided a method of forming patterns for a semiconductor device, including: forming a first hard mask layer on a layer which is to be etched; forming a second hard mask layer on the first hard mask layer, wherein the second hard mask layer includes a first portion and a second portion formed underneath the first portion, wherein the first portion and second portion are composed of the same material; etching the first portion to form first patterns; forming spacers covering sidewalls of the first patterns; etching the second portion using the spacers as etch masks to form second patterns; etching the first hard mask layer and the spacers using the second patterns disposed underneath the spacers as etch masks to form third patterns; and etching the layer to be etched, using the third patterns.

According to another example embodiment, there is provided a method of forming patterns for a semiconductor device, including: forming a hard mask layer on a layer disposed below the hard mask layer, wherein the hard mask layer is composed of a single material; etching first parts of the hard mask layer to a predetermined height to form first patterns; forming spacers covering sidewalls of the first patterns; etching the first patterns and second parts of the hard mask layer using the spacers as etch masks to form second patterns; and etching parts of the layer disposed below the hard mask layer to form third patterns using the second patterns as etch masks.

According to a further example embodiment, there is provided a method of forming patterns for a semiconductor device, including: forming a first hard mask layer on a layer which is to be etched; forming a second hard mask layer on the first hard mask layer, wherein the second hard mask layer comprises a first portion and a second portion formed underneath the first portion, wherein the first portion and second portion are composed of the same material; etching parts of the first portion to form first patterns; forming spacers covering sidewalls of the sacrificial patterns; etching the first patterns and etching parts of the second portion using the spacers as etch masks to form second patterns, wherein etching parts of the second portion includes etching the second portion except for an area disposed below the spacers; etching the spacers and etching parts of the first hard mask layer using the second patterns to form third patterns; and etching the layer to be etched using the third patterns.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1A:
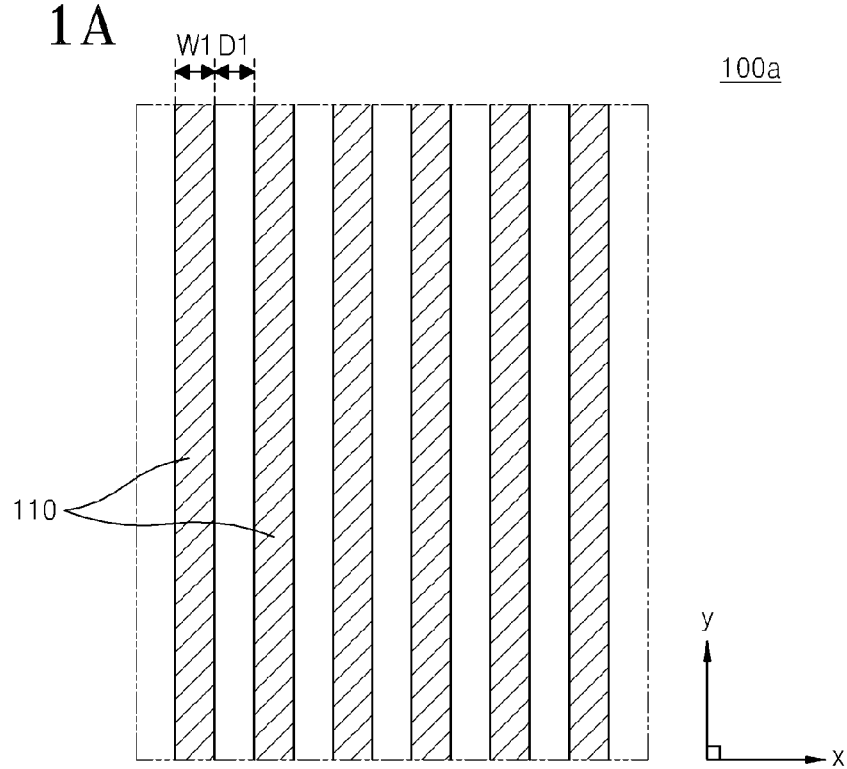
FIGS. 1A and 1B are layout views illustrating semiconductor devices which are formed using a pattern forming method according to exemplary embodiments.

Various example embodiments will now be described more fully with reference to the accompanying drawings, in which some example embodiments are shown. The inventive concept may, however, be embodied in many different forms and should not be construed as being limited to the embodiments set forth herein.

In the drawings, for example, according to manufacturing technique and/or tolerance, modifications of shown shapes may be expected. Therefore, the embodiments should not be construed as being limited to specific shapes of areas shown in the specification of the disclosure, for example, should include changes in shapes resulting from manufacturing.

It will be understood that, although the terms first, second, third etc. may be used herein to describe various elements, these elements should not be limited by these terms. These terms are used to distinguish one element from another. Thus, a first element discussed below could be termed a second element without departing from the teachings of the disclosed embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact" as used herein indicates a direct touching of elements.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 1B:
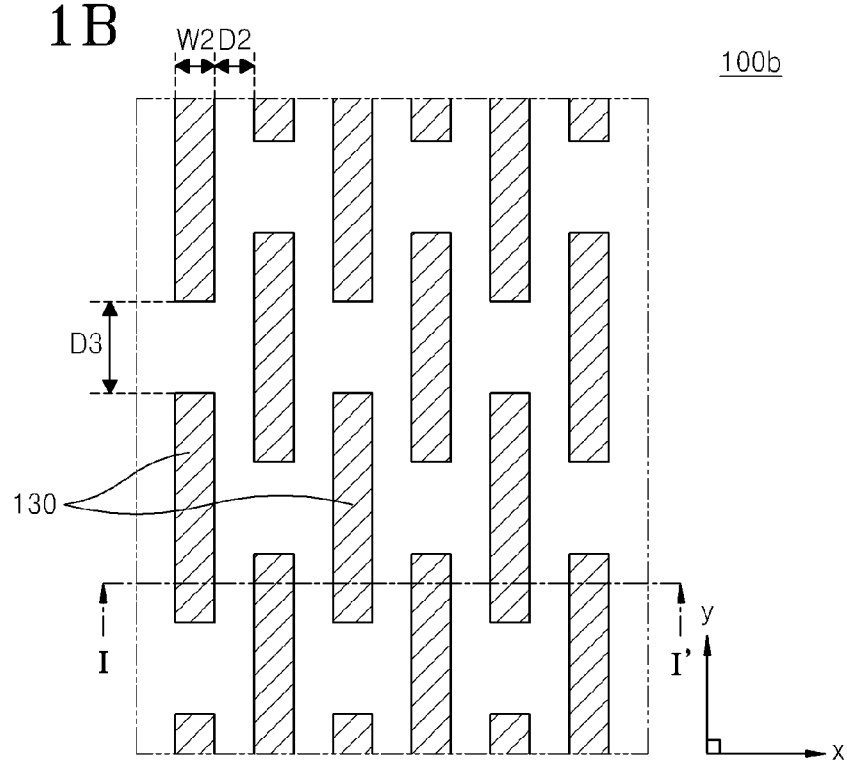

FIGS. 1A and 1B are layout views illustrating semiconductor devices 100a and 100b which are formed using a pattern forming method according to exemplary embodiments. In one embodiment, if the semiconductor devices 100a and 100b of FIGS. 1A and 1B are memory devices, the portions of semiconductor devices 100a and 100b depicted in FIGS. 1A and 1B may correspond to cell array areas in which unit memory devices (e.g., cells) are formed.

Referring to FIG. 1A, the semiconductor device 100a includes a plurality of patterns which have first widths W1 and are in parallel with first distances D1 between one another in a first direction (an x-direction of FIG. 1A). The patterns extend in a second direction (a y-direction of FIG. 1A), for example, perpendicular to the first direction.

For example, the patterns may constitute active areas or conductive layers of a cell array area or a peripheral area of the semiconductor device 100a. The conductive layers may be wordlines or bitlines. The first widths W1 and the first distances D1 may be arbitrarily designed according to a type and a desired characteristic of the semiconductor device 100a. For example, the first widths W1 may be the same size as the first distances D1. Alternatively, the first widths W1 may be greater or smaller than the first distances D1.

Referring to FIG. 1B, the semiconductor device 100b includes a plurality of patterns 130 which have second widths W2 and are arranged at second distances D2 from one another in a first direction (an x-direction of FIG. 1B). The patterns 130 maintain third distances D3 from one another in a second direction (a y-direction of FIG. 1B), for example, perpendicular to the first direction. In the embodiment shown in FIG. 1B, the patterns 130 are formed of island types.

For example, the patterns 130 may constitute active areas or conductive layers of a cell array area or a peripheral area of the semiconductor device 100b. The second widths W2, the second distances D2, and the third distances D3 may be arbitrarily designed according to a type and a desired characteristic of the semiconductor device 100b.

FIGS. 2 through 9 are cross-sectional views and a perspective view illustrating a method of forming patterns for the semiconductor device 110b according to exemplary embodiments. FIGS. 2 through 9 illustrate a part taken along a line I-I' of FIG. 1B.

Figure 2:
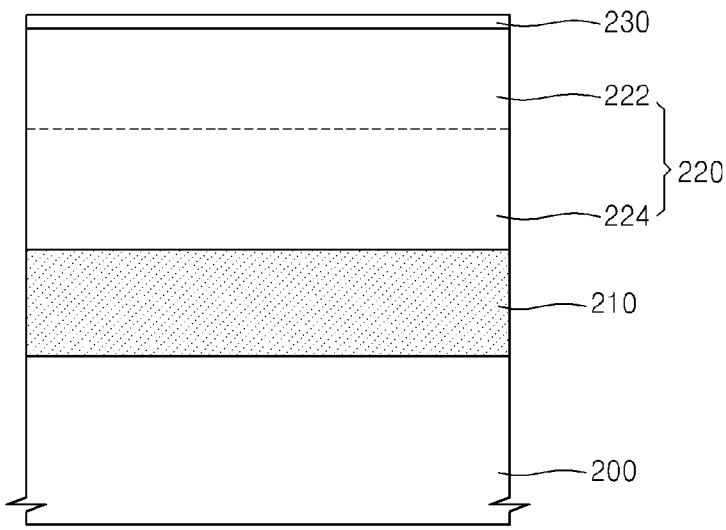
FIGS. 2 through 9 are cross-sectional views and a perspective view illustrating a method of forming patterns for a semiconductor device, according to exemplary embodiments.

Referring to FIG. 2, a first hard mask layer 210, a second hard mask layer 220, and an anti-reflection layer 230 are sequentially formed on a substrate 200.

In this embodiment, the substrate 200 corresponds to a layer that is to be etched. For example, the substrate 200 may be a general semiconductor substrate such as a silicon substrate. The exemplary embodiments shown in FIGS. 2-9 depict the layer to be etched as a substrate 200. However, according to other exemplary embodiments, the layer to be etched (e.g., the layer beneath the first hard mask layer 210) may be another type of layer, such as a conductive layer or an insulating layer. For example, the layer to be etched may be formed of a semiconductor material or an insulating material, and whether it is a substrate, a conductive layer, or an insulating layer, it may be etched according to the processes described below.

The first hard mask layer 210 is used as a mask for forming patterns on the substrate 200. The first hard mask layer 210 may be formed of various types of layer materials according to the type of the substrate 200. For example, the first hard mask layer 210 may be formed of one selected from silicon-containing materials such as silicon oxide ($SiO_2$), silicon nitride ($Si_3N_4$), polysilicon, and the like. For example, the first hard mask layer 210 may be formed using a chemical vapor deposition (CVD). According to a modified exemplary embodiment, the first hard mask layer 210 may be omitted.

The second hard mask layer 220 includes a first portion 222 (i.e., sub-layer) which has a predetermined height at an upper part and a second portion 224 (i.e., sub-layer) at a lower part. The first and second portions 222 and 224 are separately shown for convenience of descriptions of subsequent processes, but in one embodiment, are formed of the same material to constitute the second hard mask layer 220. The first portion 222 may be used as a sacrificial layer for forming a plurality of etch mask patterns having doubled pattern densities.

The second hard mask layer 220 may be formed of a material having different etch selectivity from the first hard mask layer 210 to be used as an etch mask for the first hard mask layer 210. The second hard mask layer 220 may be formed, for example, of a carbon-containing layer. In one embodiment, the second hard mask layer 220 may be formed of a hydrocarbon compound having a relatively high carbon content between about 85 wt % and about 99 wt % based on a total weight, such as an amorphous carbon layer (ACL) or a spin-on hard mask (SOH), or a hydrocarbon derivative. Alternatively, the second hard mask layer 220 may be formed of a metal or an organic material.

For example, the first hard mask layer 210 may be formed of $SiO_2$, and the second hard mask layer 220 may be formed of a carbon-containing layer. Alternatively, the first hard mask layer 210 may be formed of silicon oxynitride (SiON), and the second hard mask layer 220 may be formed of a carbon-containing layer.

The second hard mask layer 220 may be formed using, for example, a spin coating process or a CVD process. A process of forming the second hard mask layer 220 of a carbon-containing layer will be now exemplified. An organic compound layer having a thickness between about 1000 Å and about 2000 Å is formed on the first hard mask layer 210. Here, a spin coating process or another type of deposition process may be used. The organic compound layer may be formed of a hydrocarbon compound, including an aromatic ring such as phenyl, benzene, or naphthalene, or a hydrocarbon derivative. The organic compound layer may be formed of a material having a relatively high carbon content between about 85 wt % and about 99 wt % based on a total weight. The organic compound layer is primarily baked, for example, at a temperature between about 150° C. and about 350° C. to form a carbon-containing layer. The primary baking may be performed, for example, for about 60 seconds. The carbon-containing layer is secondarily baked and hardened, for example, at a temperature between about 300° C. and about 550° C. The secondary baking may be performed, for example, for about 30 seconds to about 300 seconds. Although a deposition process is performed at a relatively high temperature of about 400° C. or more when the carbon-containing layer is secondarily baked as described above to form another layer on the carbon-containing layer, the carbon-containing layer may not be damaged during the deposition process.

The anti-reflection layer 230 performs an anti-reflection in a subsequent photolithography process. The anti-reflection layer 230 may include, for example, an organic material or an inorganic material. For example, the anti-reflection layer 230 may include SiON.

Within the disclosure, materials of which the first hard mask layer 210, the second hard mask layer 220, and the anti-reflection layer 230 are respectively formed are not limited to the materials which have been exemplarily described above. The first hard mask layer 210, the second hard mask layer 220, and the anti-reflection layer 230 may be formed of materials having different etch selectivities from one another under fixed etch conditions.

Figure 3:
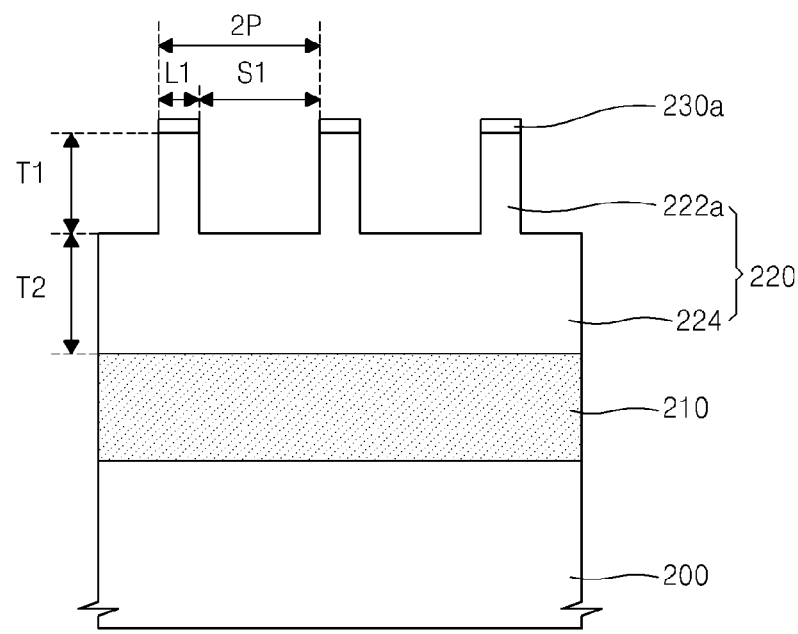

Referring to FIG. 3, in a first step, the anti-reflection layer 230 and the first portion 222 of the second hard mask layer 220 are etched to form anti-reflection patterns 230a and first patterns 222a. The second portion 224 of the second hard mask layer 220 is not patterned. For example, during the etching, parts of the anti-reflection layer 230 and the first portion 222 of the second hard mask layer 220 are removed to form the patterns. As such, etching may refer to not etching an entire layer away, but etching parts of it to form patterns.

A photoresist layer (not shown) may be formed and then patterned using a photolithography process, and an etch process may be performed with respect to the anti-reflection layer 230 and the first portion 222 of the second hard mask layer 220 to perform the patterning process.

The photolithography process may use, for example, an immersion lithography technique. The immersion lithography technique refers to a technique for filling a high refractive index fluid between a lens and a material which is to be exposed to light to increase a numerical aperture (NA), thereby improving resolution.

The etch process may involve, for example, dry etching or reactive ion etching (RIE). If the second hard mask layer 220 is formed of the carbon-containing layer described with reference to FIG. 2, a plasma etch process using a mixture gas of oxygen ($O_2$) and argon (Ar) may be performed to etch the second hard mask layer 220. The plasma etch process adjusts process conditions, such as an etch time, etc., to etch a part of the first portion 222 of the second hard mask layer 220.

The first portion 222 of the second hard mask layer 220 has a first thickness T1, and the second portion 224 of the second hard mask 220 has a second thickness T2. If the first portion 222 is too thick, the first patterns 222a may lean. Therefore, the first thickness T1 may be determined in consideration of an aspect ratio. The first thickness T1 may be equal to the second thickness T2. Alternatively, the first thickness T1 may be thinner or thicker than the second thickness T2.

Line widths L1 of the first patterns 222a may correspond to the second distances D2 at which the patterns 130 of FIG. 1B are arranged. The line widths L1 may correspond to a feature size of a semiconductor device to be formed. The line widths L1 may be between several nanometers and several tens of nanometers. In one embodiment, spaces S1 between adjacent ones of the first patterns 222a may be greater than the line widths L1 of the first patterns 222a. The spaces S1 may have widths, for example, from 2.5 times to 3.5 times wider than the line widths L1 of the first patterns 222a. A sum of a line width L1 and a space S1 may have a size corresponding to twice a pitch P of the semiconductor device to be formed.

In the embodiment, the pattern forming method, the first thickness T1 of the first portion 222 of the second hard mask layer 220, which is etched according to the line widths L1 of the first patterns 222a, may be controlled to prevent the aspect ratio from increasing above a particular value (e.g., 4:1, 3:1). Therefore, the first patterns 222a may be prevented from leaning, and thus, line widths of mask patterns which will be formed in a subsequent process may be prevented from varying.

Figure 4:
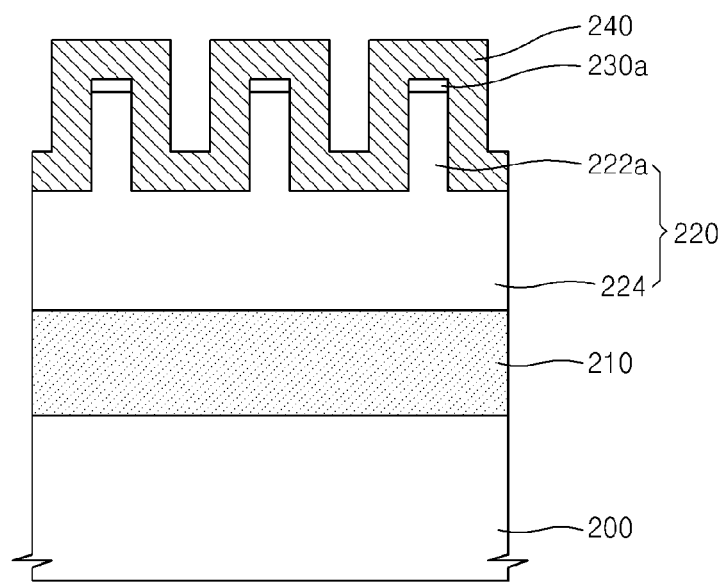

Referring to FIG. 4, a spacer mask layer 240 is formed to cover exposed surfaces of the anti-reflection patterns 230a, sidewalls of the first patterns 222a, and an exposed surface of the second portion 224 of the second hard mask layer 220.

A thickness of the spacer mask layer 240 may be determined, for example, according to second widths W2 of the patterns 130 (refer to FIG. 1B) which are to be formed. The thickness of the spacer mask layer 240 may be equal to each of the line widths L1 of the first patterns 222a. Alternatively, the thickness of the spacer mask layer 240 may be narrower or wider than each of the line widths L1 of the first patterns 222a.

The spacer mask layer 240 may be formed of a material having a different etch selectivity from the second hard mask layer 220. For example, the spacer mask layer 240 may be formed of an oxide layer. The spacer mask layer 240 may be formed above the substrate 200 to a uniform thickness using, for example, an atomic layer deposition (ALD) process.

Figure 5:
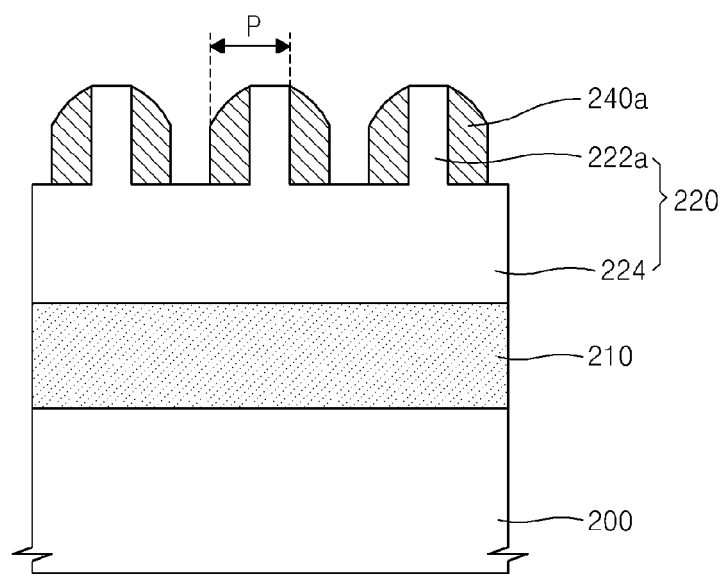

Referring to FIG. 5, the spacer mask layer 240 is etched until upper surfaces of the first patterns 222a and an upper surface of the second portion 224 of the second hard mask layer 220 are exposed, thereby forming spacers 240a covering the sidewalls of the first patterns 222a.

In one embodiment, the spacers 240a are used as etch masks for doubling pattern densities in a subsequent process. Each of the widths of the first patterns 222a and each of the widths of the spacers 224a on sidewalls of the first patterns 222a may have a size corresponding to the pitch P of the semiconductor device to be formed.

When the spacer mask layer 240 is etched, the anti-reflection patterns 230a are also etched and removed. In other words, the spacer mask layer 240 and the anti-reflection patterns 230a may be formed of materials having the same etch selectivity as the second hard mask layer 220. According to another exemplary embodiment, the anti-reflection patterns 230a may remain on the first patterns 222a after etching.

In certain embodiments, the spacer mask layer 240 may be etched using a CxFy (where x and y are respectively integers between 1 and 10) gas or a CHxFy (where x and y are respectively integers between 1 and 10) gas as a main etch gas. Alternatively, the main etch gas may be mixed with at least one gas selected from oxygen ($O_2$) and Ar and then used to etch the spacer mask layer 240. Hexafluoropropylene ($C_3F_6$), hexafluoro-2-butyne ($C_4F_6$), octafluorocyclobutane ($C_4F_8$), or octafluoropentyne ($C_5F_8$) may be used as the CxFy gas. Fluoroform ($CHF_3$) or difluoromethane ($CH_2F_2$) may be used as the CHxFy gas. Here, $O_2$ mixed with the main etch gas removes a polymer by-product produced in an etch process and decomposes the CxFy gas. Also, Ar mixed with the main etch gas can be used as a carrier gas and for ion bombardment. Plasma of an etch gas selected from the exemplary etch gases may be produced in an etch chamber to etch the spacer mask layer 240 in a plasma atmosphere. Alternatively, the spacer mask layer 240 may be etched in an atmosphere of the selected etch gas in no energy state without producing the plasma in the etch chamber. For example, a mixture gas of $C_4F_6$, $CHF_3$, $O_2$, and Ar may be used as an etch gas to etch the spacer mask layer 240. In this case, a plasma dry etch process may be performed for several seconds to dozens of seconds by respectively supplying $C_4F_6$, $CHF_3$, $O_2$, and Ar so that a volumetric ratio of $C_4F_6:CHF_3:O_2:Ar$ is about 1:6:2:14.

Figure 6:
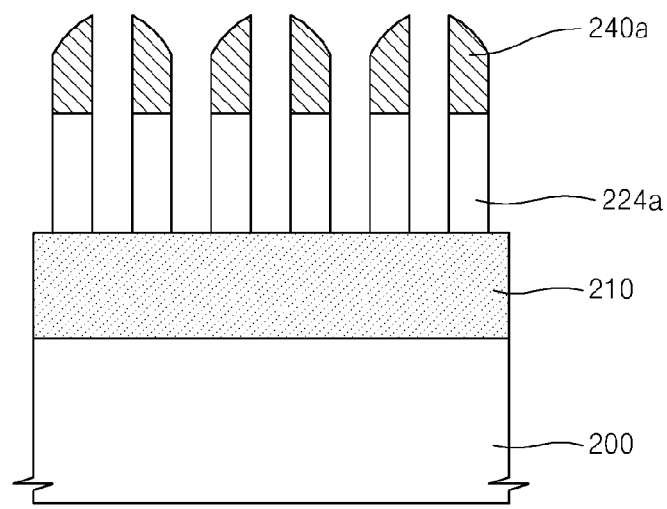

Referring to FIG. 6, the first patterns 222a and a part of the second portion 224 of the second hard mask layer 220 are removed. Since the first patterns 222a are first removed, the second portion 224 of the second hard mask layer 220 is exposed through a space between each two adjacent spacers 240a. Therefore, all parts of the second hard mask layer 220, except for areas of the second hard mask layer 220 located underneath the spacers 240a, are removed, and thus, second patterns 224a are formed.

The process of removing parts of the second hard mask layer 220 including the first patterns 222a and the second portion 224, may be performed under conditions in which the spacers 240a and the first hard mask layer 210 are inhibited from being etched.

In one embodiment, an anisotropic etch process using a dry or wet etch process may be performed to remove the first patterns 222a and parts of the second portion 224 of the second hard mask layer 220. For example, a mixture gas of $O_2$ and Ar may be used as an etch gas to remove the first patterns 222a and parts of the second portion 224 using the dry etch process. For example, a plasma dry etch process may be performed for several seconds to dozens of seconds at a pressure between about 1 mT and about 30 mT and a temperature between about −10° C. and about 40° C. by supplying $O_2$ and Ar so that a volumetric ratio of $O_2:Ar$ is about 1:4~1:8.

In the embodiments, as described above with reference to FIG. 3, after the second hard mask layer 220 is partially etched, the spacers 240a are finally formed. Therefore, the first patterns 222a and exposed parts of the second portion 224 between the spacers 240 may be removed in a single process of the method. Accordingly, processes may be simplified more than when an additional mask layer is used instead of the second layer 224.

Figure 7:
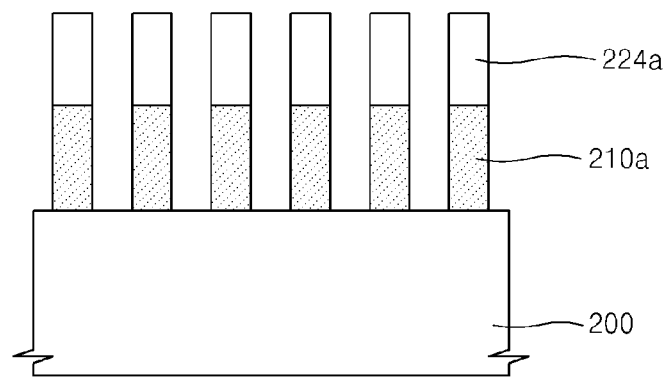

Referring to FIG. 7, parts of the first hard mask layer 210 are removed using the spacers 240a and the second patterns 224a as etch masks to form first hard mask patterns 210a.

When the first hard mask layer 210 is etched, the spacers 240a are also etched and removed. In other words, the spacers 240a and the first hard mask layer 210 may be formed of materials having the same etch selectivity as the second patterns 224a and the substrate 200.

As shown in FIG. 7, in one embodiment, when the first hard mask layer 210 is etched, parts of exposed surfaces of the second patterns 224a are consumed, and thus, heights of the second patterns 224a are lowered. In particular, although not shown in FIG. 7, edges of the upper surfaces of the second patterns 224a may be consumed by an etch gas, and thus, the second patterns 224 may have round profiles.

Figure 8:
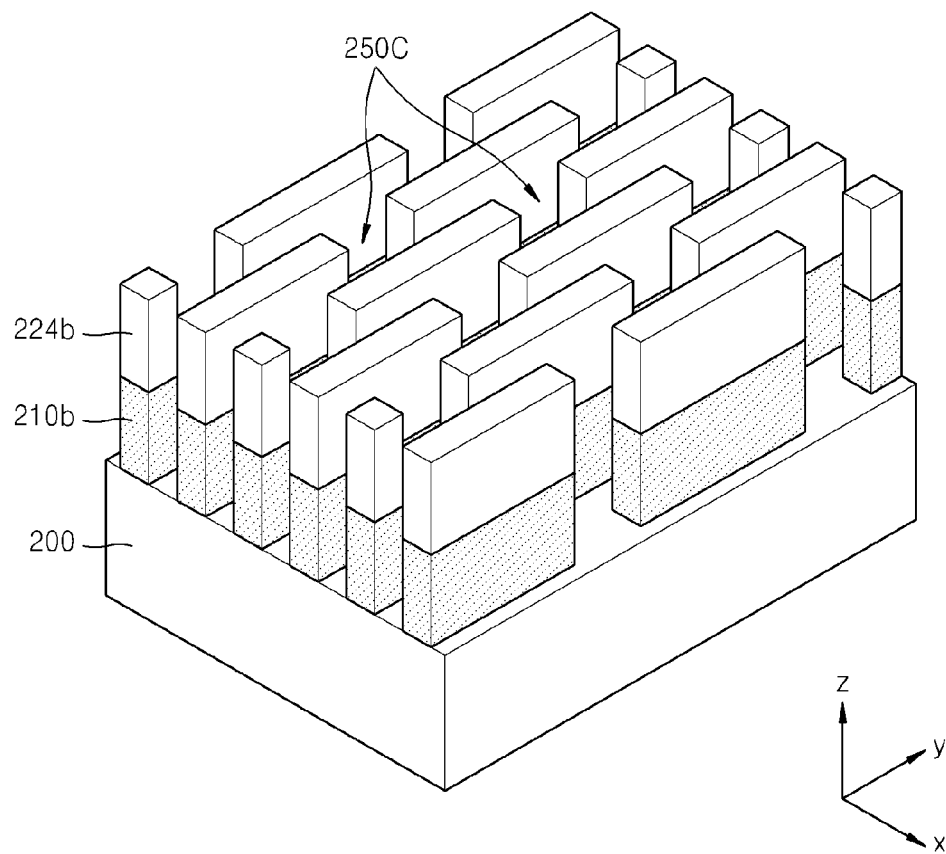

Referring to FIG. 8, a trim process is performed at a specific area to trim the second patterns 224a and the first hard mask patterns 210a. The trim process is to trim parts of the first hard mask patterns 210a and the second patterns 224a which are formed as line shapes, thereby forming first hard mask island patterns 210b and second island patterns 224b.

An additional mask layer (not shown) may be formed on the second patterns 224a and the first hard mask patterns 210a, and then patterning and etch processes using photolithography may be performed to perform the trim process. The additional mask layer may be a SOH, for example.

Openings 250C are formed with third distances D3 from one another to form the patterns 130 with the third distances D3 from one another, as shown in FIG. 1B. The mask layer for forming the openings 250C is patterned to remove the second patterns 224a and the first hard mask patterns 210a.

An ashing or strip process may be used to remove the second patterns 224a and the first hard mask patterns 210a. Alternatively, a dry or wet etch process may be used to remove the second patterns 224a and the first hard mask patterns 210a. The etch process may be performed as a single process simultaneously with respect to the second patterns 224a and the first hard mask patterns 210a. Alternatively, the etch process may be performed sequentially with respect to the second patterns 224a and the first hard mask patterns 210a.

Figure 9:
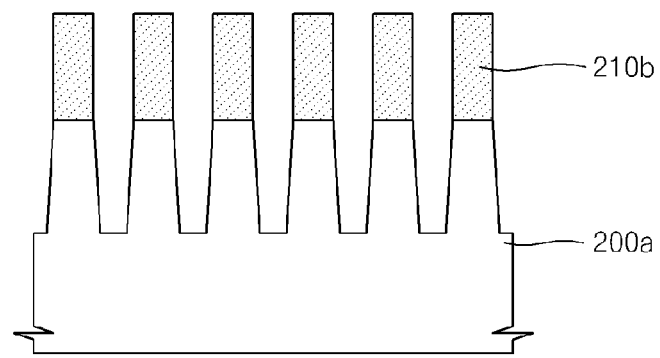

Referring to FIG. 9, a part of the substrate 200 is removed using the second island patterns 224b and the first hard mask island patterns 210b as etch masks to form substrate patterns 200a. The second island patterns 224b may be etched and removed in the process of etching the part of the substrate 200. The substrate patterns 200a may be formed using an anisotropic etch process, for example, using a plasma etch process.

In one embodiment, the first hard mask island patterns 210b are removed to finally form the substrate patterns 200a.

According to the pattern forming method according to the exemplary embodiment described with reference to FIGS. 2 through 9, pattern densities may be doubled using a double patterning process using the spacers 240a formed on the sidewalls of the first patterns 222a as etch masks to form the substrate patterns 200a having narrow widths. In this process, the method of partially removing the second hard mask layer 220 to form the first patterns 222a may be used. Therefore, since an additional mask layer is not required, processes may be simplified, and process unit cost may be lowered.

Also, since a one-time etch process is performed for patterning the substrate 200 after the trim process, a pattern erosion such as corner rounding of island patterns may not occur. In addition, since the trim process may be performed immediately before the substrate 200 is patterned, an occurrence of a loading effect due to island patterns may be reduced. The loading effect refers to a phenomenon in which an etch speed of a layer to be etched becomes non-uniform due to non-uniformity of an etchant reacting with the layer. According to the disclosed embodiments, such a loading effect may contribute to a reduction in leaning of patterns and a realization of patterns having uniform line widths.

Figure 10:
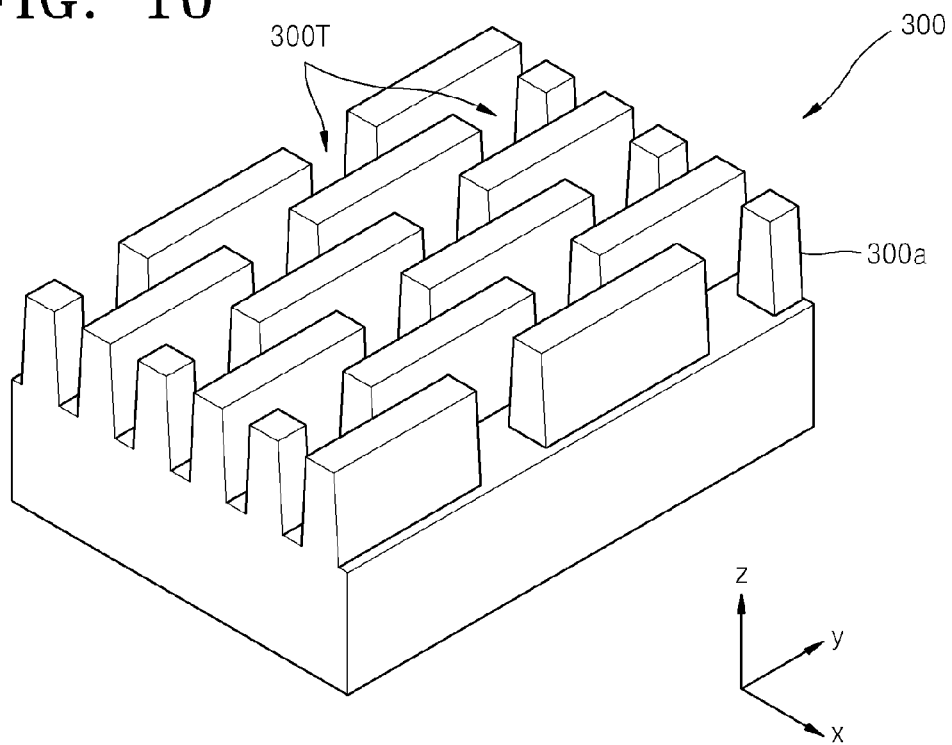
FIG. 10 is a perspective view illustrating a semiconductor device using the pattern forming method according to an exemplary embodiment.

FIG. 10 is a perspective view illustrating a semiconductor device 300 using the pattern forming method described herein, according to an exemplary embodiment.

Referring to FIG. 10, active area patterns 300a of the semiconductor device 300 are arranged. The active area patterns 300a may be formed using the pattern forming method described above with reference to FIGS. 2 through 9. The active area patterns 300a may be formed of a plurality of island patterns. Trenches 300T are formed between the active area patterns 300a, and an insulating material is deposited in the trenches 300T in a subsequent process to form an isolation layer.

According to the pattern forming method disclosed herein, since an etch process for forming active areas is performed after a trim process as described above, corner rounding and a loading effect may be prevented, thereby forming active areas having uniform line widths. If the semiconductor device 300 is a dynamic random access memory (DRAM) device, bitline contacts may be formed on the active area patterns 300a. In this case, since line widths of active areas decrease or corner rounding of active areas decreases, contact areas of the bitline contacts with the active areas may not decrease. Therefore, increases in resistances of the bitline contacts due to the decrease in the contact areas may be prevented.

According to the pattern forming method, the active area patterns 300a may be repeatedly formed in a fine pitch of about ½ of a pitch which may be realized in a general photolithography process. Accordingly, a plurality of active areas having fine widths may be easily repeatedly realized in a fine pitch transcending a resolution limit in a photolithography process.

Also, since fine patterning may be performed using a single photolithography process, defects and a deviation of pattern widths due to misalignment resulting from a double exposure process may be prevented.

Figure 11:
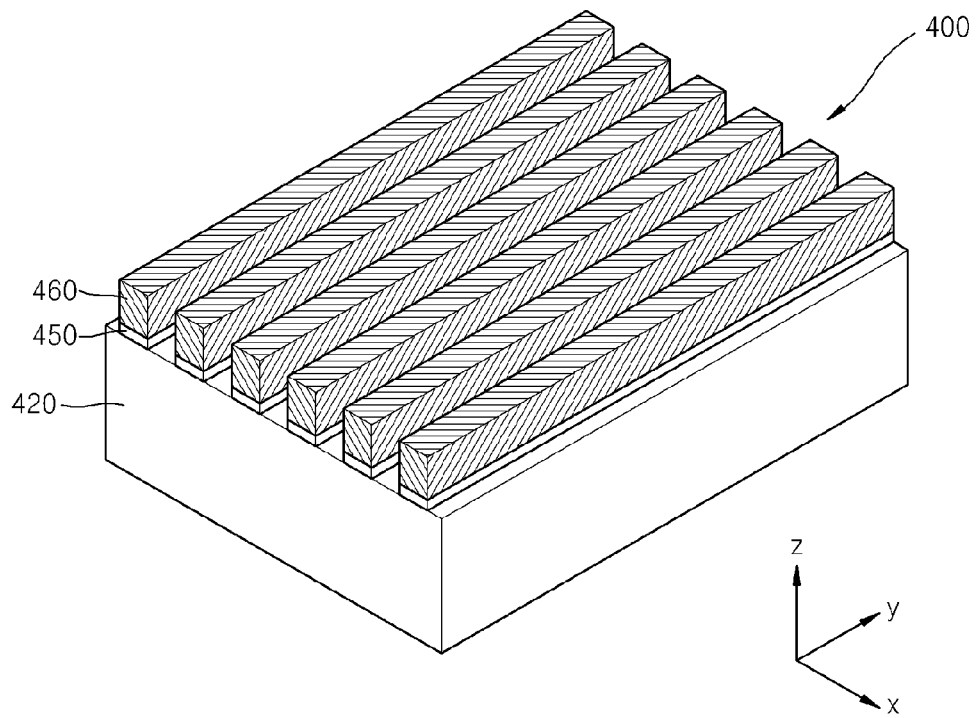
FIG. 11 is a perspective view illustrating a semiconductor device using the pattern forming method according to another exemplary embodiment.

FIG. 11 is a perspective view illustrating a semiconductor device 400 formed using the pattern forming method described herein, according to another exemplary embodiment.

Referring to FIG. 11, the semiconductor device 400 includes gate insulating layers 450 which are formed on a substrate 420 and wordlines 460 to which gate electrodes are connected. The gate insulating layers 450 and the wordlines 460 may be formed using the pattern forming method described with reference to FIGS. 2 through 9. Patterns are formed using stack structures of the gate insulating layers 450 and the wordlines 460 as layers which are to be etched. According to another exemplary embodiment, the gate insulating layers 450 may be formed to be curved, and the wordlines 460 may also be formed to be curved at interfaces with the gate insulating layers 450.

The substrate 420 may include a semiconductor material, e.g., a group IV semiconductor, a group III-V compound semiconductor, or a group II-VI oxide semiconductor. The gate insulating layers 450 may include silicon oxide ($SiO_2$), and the wordlines 460 may include a conductive material. For example, the wordlines 460 may include a conductive material which includes one selected from the group consisting of tantalum nitride (TaN), titanium nitride (TiN), tungsten (W), tungsten nitride (WN), hafnium nitride (HfN), tungsten silicide, and mixtures thereof. According to another exemplary embodiment, the wordlines 460 may further include charge storage layers (not shown) which are formed on the gate insulating layers 450.

The semiconductor device 400 may be a memory device such as a dynamic random access memory (DRAM) device, a phase-change random access memory (PRAM) device, or a flash memory device.

According to certain embodiments, the wordlines 460 of the semiconductor device 400 may be formed in fine line shapes having sizes of several tens of nanometers, e.g., 30 nm or less. Also, the number of mask layers may be minimized to simplify processes.

Figure 12:
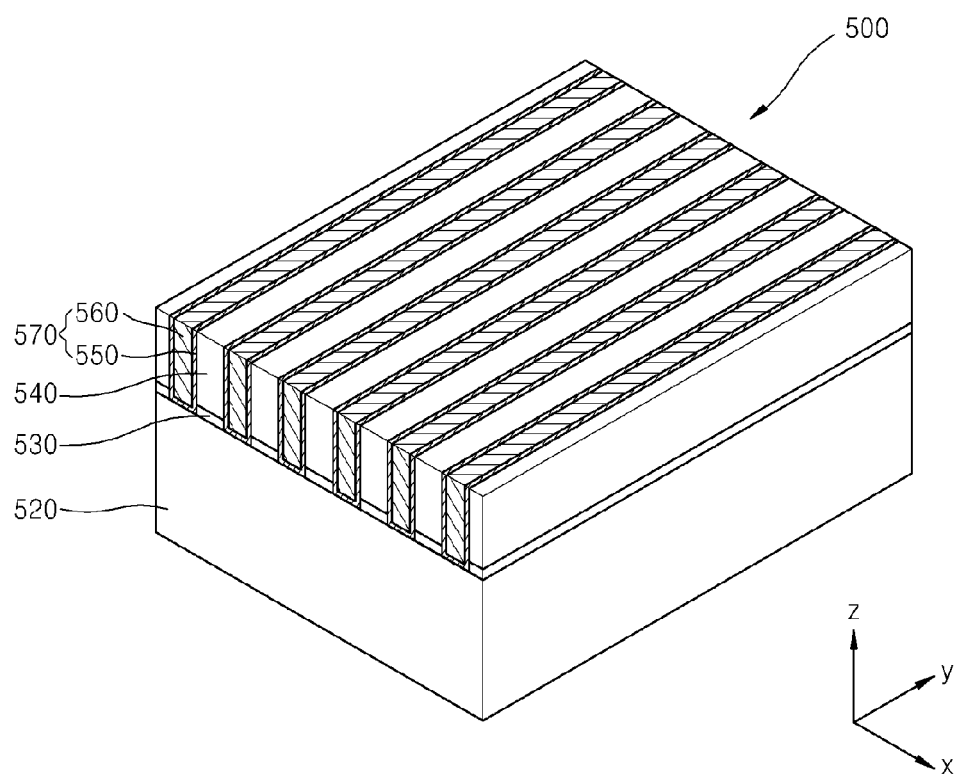
FIG. 12 is a perspective view illustrating a semiconductor device using the pattern forming method according to another exemplary embodiment.

FIG. 12 is a perspective view illustrating a semiconductor device 500 using the pattern forming method described herein, according to another exemplary embodiment.

Referring to FIG. 12, the semiconductor device 500 includes a substrate 520 on which predetermined unit devices, e.g., a plurality of wordlines and an interlayer insulating layer covering the wordlines, are formed, and bitlines 570.

The bitlines 570 includes diffusion barrier layers 550 and conductive layers 560. Etch stop layers 530 are formed between the bitlines 570, and insulating layers 540 are formed on the etch stop layers 530 between the bitlines 570.

The bitlines 570 may be formed using the pattern forming method described with reference to FIGS. 2 through 9. In other words, for forming the bitlines 570, the bitlines 570 may be patterned using stack structures of the etch stop layers 530 and the insulating layers 540 as layers to be etched, and then the diffusion barrier layers 550 and the conductive layers 560 may be stacked. According to a modified exemplary embodiment, the bitlines 570 may be patterned using stack structures of the diffusion barrier layers 550 and the conductive layers 560 as layers to be etched, and then the insulating layer 540 may be formed between all adjacent bitlines 570.

The etch stop layers 530 may be formed, for example, of silicon nitride (SiNx), and the insulating layers 540 may be formed of oxide.

The diffusion barrier layers 550 are formed to prevent metal atoms of the conductive layers 560 from diffusing to other layers disposed around the conductive layers 560. The diffusion barrier layers 550 may be formed to each have a thickness between several angstroms and hundreds of angstroms. The diffusion barrier layers 550 may be formed, for example, of one selected from the group consisting of tantalum (Ta), TaN, TiN, tantalum silicon nitride (TaSiN), titanium silicon nitride (TiSiN), and mixtures thereof. The diffusion barrier layers 550 may be formed, for example, using a CVD process or a sputtering process. According to another exemplary embodiment, the diffusion barrier layers 550 may be omitted.

The conductive layers 560 may be formed, for example, of one selected from the group consisting of copper (Cu), W, and aluminum (Al). The conductive layers 560 may be formed, for example, using a physical vapor deposition (PVD) process or an electroplating process.

In one embodiment, a chemical mechanical polishing (CMP) process may be used to stack the diffusion barrier layers 550 and the conductive layers 560, remove parts of the diffusion barrier layers 550 and the conductive layers 560, and pattern the diffusion layers 550 and the conductive layers 560. As described above, the bitlines 570 may be formed using a damascene process. According to certain embodiments, the bitlines 570 of fine sizes having doubled pattern densities may be formed.

Figure 13A:
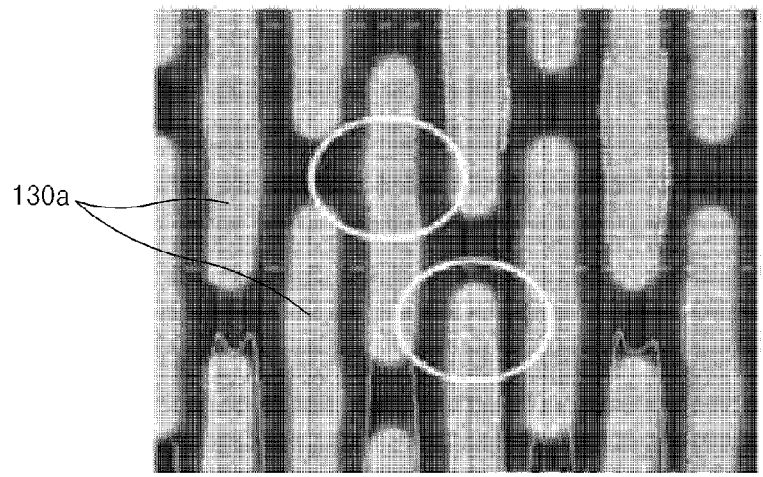
FIG. 13A is a photo illustrating active areas of semiconductor devices which are formed using the pattern forming method in the conventional art.
Figure 13B:
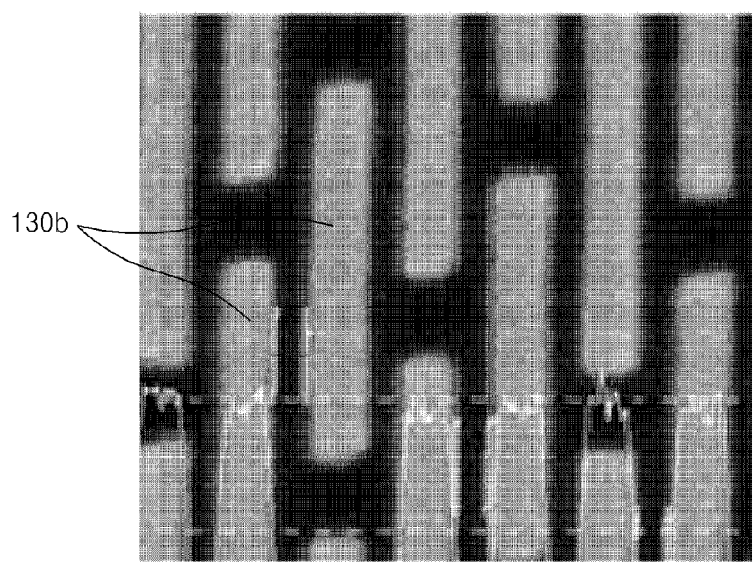
FIG. 13B is a photo illustrating active areas of semiconductor devices which are formed using the pattern forming method according to example embodiments.

FIG. 13A is a photo illustrating active areas of semiconductor devices formed using the pattern forming method according to the conventional art, and FIG. 13B is a photo illustrating active areas of semiconductor devices which are formed using the pattern forming method according to example embodiments.

Referring to FIGS. 13A and 13B, changes in patterns using the pattern forming method of the disclosed embodiments clearly appear. The photo of FIG. 13A illustrates the semiconductor device in which mask layers, each of which is formed of two layers, are formed on layers to be etched, the upper mask layers are line-patterned, and active area patterns 130a are finally formed. However, the active area patterns 130a are not uniformly formed and are rounded at the both end of the patterns. The photo of FIG. 13B illustrates the semiconductor device in which line patterns of mask layers formed on layers to be etched are all formed, a trim process is performed. In other words, the trim process is performed with respect to the upper mask layers, the lower mask layers are patterned using the trimmed upper mask patterns, and active area patterns 130b are finally formed.

According to the certain embodiments, active areas are formed immediately after a trim process is performed. Therefore, rounding of the active areas, which may occur due to an etch process repeatedly performed with respect to mask layers, does not occur, and line widths are uniformly formed. Also, heights of patterns of a hard mask layer, parts of which is etched to form spacers, are adjusted to prevent leaning of the patterns, thereby uniformly forming the line widths.

Accordingly, characteristics of transistors formed on the active areas may be uniform. Also, resistances of contacts formed on the active areas are prevented from rising.

Figure 14:
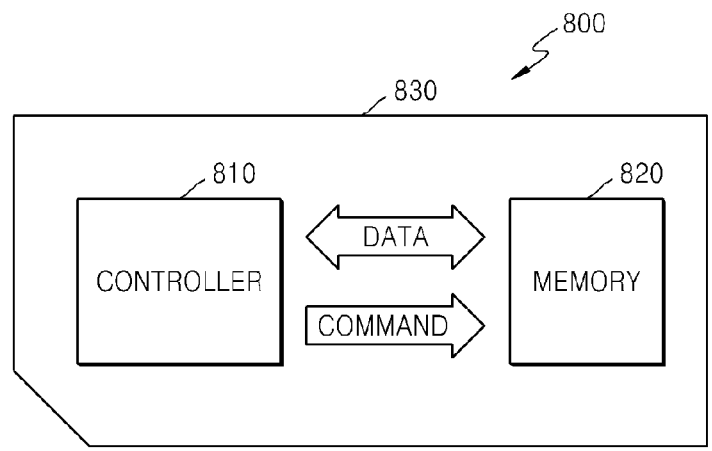
FIG. 14 is a block diagram illustrating a memory card including a semiconductor device according to exemplary embodiments.

FIG. 14 is a block diagram illustrating a memory card 800 including a semiconductor device according to exemplary embodiments.

Referring to FIG. 14, the memory card 800 includes a controller 810 and a memory 820, such as DRAM (including DDR and SDRAM), NAND flash, and NOR flash, RRAM, PRAM, and MRAM, or other memory systems etc., which are installed in a housing 830. The controller 810 and the memory 820 exchange electric signals with each other. For example, the controller 810 and the memory 820 exchange data with each other according to a command of the controller 810. In one embodiment, the memory card 800 stores data in the memory 820 or outputs the data from the memory 820 to the outside. Cell array areas may be formed in the memory 820 using the pattern forming method according to the disclosed embodiments.

In addition, the memory card 800 may be used as a data storage medium of various types of portable devices. For example, the memory card 800 may include a multimedia card (MMC) or a secure digital (SD) card.

Figure 15:
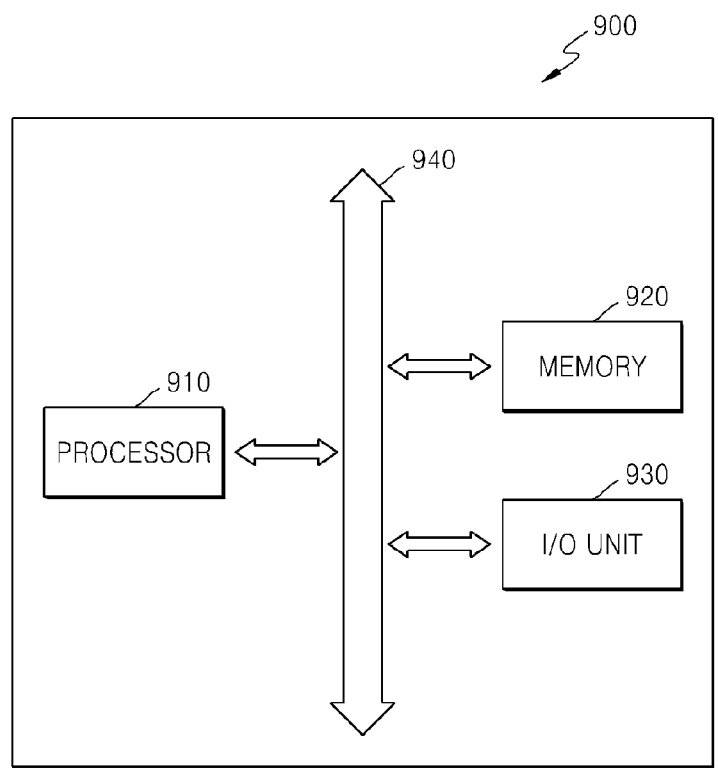
FIG. 15 is a block diagram illustrating an electronic system including a semiconductor device according to exemplary embodiments.

FIG. 15 is a block diagram illustrating an electronic system 900 including a semiconductor device according to exemplary embodiments.

Referring to FIG. 15, the electronic system 900 includes a processor 910, an input/output (I/O) unit 930, and a memory 920 which communicate data with one another through a bus 940. The processor 910 executes programs and controls the electronic system 900. The I/O unit 930 is used to input and/or output data of the electronic system 900. The electronic system 900 is connected to an external device, e.g., a personal computer (PC) or a network, using the I/O unit 930 to exchange data with the external device. The memory 920 stores codes and data for an operation of the processor 910. The memory 920 may include a memory device, such as DRAM (including DDR and SDRAM), NAND flash, and NOR flash, RRAM, PRAM, and MRAM, or other memory systems etc., which is formed using the pattern forming method according to the disclosed embodiments.

In addition, the electronic system 900 may constitute various types of electronic control devices requiring the memory 920, e.g., may be applied to a mobile phone, an MPEG Audio Layer-3 (MP3) player, a navigation system, a solid state disk (SSD), household appliances, etc.

The electronic system 900 according to some example embodiments may be mounted on a printed circuit board (PCB) by using various packages. These various packages may include, for example, PoP (Package on Package), BGAs (Ball grid arrays), CSPs (Chip scale packages), PLCC (Plastic Leaded Chip Carrier), PDIP (Plastic Dual In-Line Package), Die in Waffle Pack, Die in Wafer Form, COB (Chip On Board), CERDIP (Ceramic Dual In-Line Package), MQFP (Plastic Metric Quad Flat Pack), TQFP (Thin Quad Flat-Pack), SOIC (Small Outline Integrated Circuit), SSOP (Shrink Small Outline Package), TSOP (Thin Small Outline Package), TQFP (Thin Quad Flat-Pack), SIP (System In Package), MCP (Multi Chip Package), WFP (Wafer-level Fabricated Package) and WSP (Wafer-Level Processed Stack Package).

While the present disclosure has been particularly shown and described with reference to exemplary embodiments thereof, it will be understood that various changes in form and details may be made therein without departing from the spirit and scope of the following claims.

What is claimed is:

1. A method of forming patterns for a semiconductor device, comprising:
    forming a first hard mask layer on a layer which is to be etched;
    forming a second hard mask layer on the first hard mask layer, wherein the second hard mask layer comprises a first portion and a second portion formed underneath the first portion, wherein the first portion and second portion are composed of the same material;
    etching the first portion to form first patterns;
    forming spacers covering sidewalls of the first patterns;
    etching the second portion using the spacers as etch masks to form second patterns;
    etching the first hard mask layer and the spacers using the second patterns disposed underneath the spacers as etch masks to form third patterns; and
    etching the layer to be etched, using the third patterns.

2. The method of claim 1, wherein a single process is used to form the second patterns, the single process including removing parts of the second portion, except for areas of the second portion located underneath the spacers, and removing the first patterns.

3. The method of claim 1, wherein the first patterns, the spacers, the second patterns, and the third patterns have line shapes.

4. The method of claim 3, further comprising, after forming the third patterns, trimming parts of the third patterns to form island patterns.

5. The method of claim 4, wherein the trimming of the parts of the third patterns comprises:
    forming etch mask layers on the third patterns having the line shapes;

forming openings exposing at least parts of the third patterns in the etch mask layers; and etching the third patterns exposed through the openings.

6. The method of claim 1, wherein after the third patterns are formed, the second patterns remain on the third patterns.

7. The method of claim 1, wherein the first portion has a first thickness, and the second portion has a second thickness, wherein the first thickness is thinner than or equal to the second thickness.

8. The method of claim 7, wherein when the first patterns are formed, the first thickness is determined according to widths of the first patterns to control an aspect ratio.

9. The method of claim 1, wherein when the third patterns are formed, the spacers are all etched when the first hard mask layer is etched.

10. The method of claim 1, wherein the first hard mask layer and the spacers comprise oxide layers, and the second hard mask layer comprises a carbon-containing layer.

11. The method of claim 1, wherein the layer to be etched comprises a semiconductor substrate, and active areas of the semiconductor substrate are defined when the layer to be etched is etched.

12. The method of claim 1, wherein the layer to be etched comprises a conducting material, and wordlines are formed when the layer to be etched is etched.

13. The method of claim 1, wherein the layer to be etched comprises an insulating material, and trenches are formed in the insulating material when the layer to be etched is etched.

14. A method of forming patterns for a semiconductor device, comprising:

forming a first hard mask layer on a layer which is to be etched;

forming a second hard mask layer on the first hard mask layer, wherein the second hard mask layer comprises a first portion and a second portion formed underneath the first portion, wherein the first portion and second portion are composed of the same material;

etching parts of the first portion to form first patterns;

forming spacers covering sidewalls of the first patterns;

etching the first patterns and etching parts of the second portion using the spacers as etch masks to form second patterns, wherein etching parts of the second portion includes etching the second portion except for an area disposed below the spacers;

etching the spacers and etching parts of the first hard mask layer using the second patterns to form third patterns; and etching the layer to be etched using the third patterns.

15. The method of claim 14, wherein a single process is used to form the second patterns, the single process including etching the parts of the second portion and etching the first patterns.

16. The method of claim 14, wherein a single process is used to form the third patterns, the single process including etching the spacers and etching the parts of the first hard mask layer.

* * * * *